United States Patent
Hwang et al.

(10) Patent No.: US 6,786,653 B1
(45) Date of Patent: Sep. 7, 2004

(54) PLUGGABLE TRANSCEIVER MODULE HAVING RELEASE MECHANISM

(75) Inventors: Jeng-Yih Hwang, Irvine, CA (US); Wayne Huang, Alhambra, CA (US); Eddy Wong, Irvine, CA (US); Hung Tieu, Alhambra, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/417,916

(22) Filed: Apr. 16, 2003

(51) Int. Cl.[7] .................................................. G02B 6/36
(52) U.S. Cl. .......................................... 385/92; 439/358
(58) Field of Search ............................. 385/62, 81, 93, 385/94, 88, 89, 92, 139; 439/357, 358, 157

(56) References Cited

U.S. PATENT DOCUMENTS

| | | | |
|---|---|---|---|
| 5,573,417 A | * 11/1996 | Hashizawa et al. | 439/310 |
| 5,901,263 A | * 5/1999 | Gaio et al. | 385/92 |
| 5,930,426 A | * 7/1999 | Harting et al. | 385/56 |
| 6,430,053 B1 | * 8/2002 | Peterson et al. | 361/728 |
| 6,439,918 B1 | * 8/2002 | Togami et al. | 439/372 |
| 6,494,623 B1 | * 12/2002 | Ahrens et al. | 385/76 |
| 6,623,287 B2 | * 9/2003 | Hatagishi et al. | 439/157 |
| 2002/0150353 A1 | * 10/2002 | Chiu et al. | 385/88 |
| 2003/0044129 A1 | * 3/2003 | Ahrens et al. | 385/92 |

* cited by examiner

Primary Examiner—Tulsidas C. Patel
(74) Attorney, Agent, or Firm—Wei Te Chung

(57) ABSTRACT

A transceiver module (1) having a release mechanism includes a connector assembly (3), a driving device (43), and a pull tab (45). The connector assembly includes a tab (362) for being received in a hole (242) of a bendable portion (240) of a receptacle (2), which receptacle receives the transceiver module therein. The driving device includes, a release member (42) and a wedge member (46). Both the pull tab and the wedge member are mechanically linked to the release member. When the pull tab is pulled outwardly, the release member rotates with respect to the connector assembly, driving the wedge member to press against the bendable portion of the receptacle, thus disengaging the tab from the hole. The transceiver module is then easily withdrawn from the receptacle. This arrangement allows the transceiver modules to be closely stacked together while still being readily accessible. This advantage decreases a stacking height of multiple transceiver modules.

20 Claims, 4 Drawing Sheets

PLUGGABLE TRANSCEIVER MODULE HAVING RELEASE MECHANISM

BACKGROUND OF THE INVENTION

1. Field of the Invention

The present invention generally relates to pluggable transceiver modules, and more particularly, to a pluggable transceiver module having a release mechanism.

2. Prior Art

Transceivers are utilized to interconnect circuit cards of communication links and other electronic modules or assemblies. Various international and industry standards define the type of connectors used to interface computers to external communication devices such as modems, network interfaces, and other transceivers. A well-known type of transceiver module developed by an industry consortium and known as a Gigabit Interface Converter (GBIC) provides an interface between a computer and an Ethernet, Fiber Channel, or other data communication environment.

It is desirable to miniaturize transceivers in order to increase the port density associated with the network connection (switch boxes, cabling patch panels, wiring closets, computer I/O, etc.). Small form-factor pluggable (SFP) transceiver modules were thus developed, the SFP transceivers being less than one half the size of a GBIC transceiver, but performing data transmission at higher rates, allowing higher aggregated data throughput in a communication system.

In order to maximize the available number of transceivers per area, multiple receptacles or sockets for SFP transceiver modules are generally arranged in rows and columns. Each SFP transceiver module is plugged into a socket or a receptacle. These sockets or receptacles are generally stacked to maximize the number of available transceiver modules per allotted area. In such stacked configurations, a release mechanism is necessary to remove a transceiver module from within a receptacle. Some detaching mechanisms of a transceiver module are disclosed in a co-pending patent application, Ser. No. 10/080,001, filed on Feb. 20, 2002 and also in another co-pending application, Ser. No. 10/163,832 filed on Jun. 5, 2002, both by the same assignee. However, this kind of detaching mechanism sometimes is not suitable for stacked transceiver modules, especially having an RJ interface, because such detaching mechanisms are not readily accessible and increase a stacking height of the multiple transceiver modules, when they are stacked in rows and columns.

Accordingly, there is a need for a pluggable transceiver module having a release mechanism that is easily accessible to an operator and which decreases the stacking height of an array of multiple transceiver modules plugged into corresponding sockets or receptacles.

SUMMARY OF THE INVENTION

In view of the foregoing, it is an object of the present invention to provide a small form-factor pluggable (SFP) transceiver module which has a release mechanism allowing an operator to conveniently withdraw the transceiver module from a complementary receptacle.

A second object of the present invention is to provide a SFP transceiver module which has a release mechanism allowing decrease in stacking height of multiple transceiver modules.

To achieve the above-mentioned objects, an SFP transceiver module having a release mechanism includes an RJ interface, a base, a housing, a driving device, and a pull tab connected to the driving device. The housing includes a tab protruding therefrom, which is designed to mate with a hole in a bendable portion on a front end of a receptacle, which receptacle receives the transceiver module. The driving device includes a release member and a wedge member. The wedge member connects to and moves with the release member. The pull tab has a front end which extends beyond a mounting surface of the transceiver module and a rear end which attaches to the release member. When the pull tab is pulled forwardly, it pulls a crossbeam of the release member forwardly, rotating and driving the wedge member to press against the bendable portion of the receptacle, disengaging the tab of the housing from the hole on the bendable portion, which makes it easier to remove the transceiver module from the receptacle.

Other objects, advantages and novel features of the present invention will be drawn from the following detailed description of preferred embodiments of the present invention.

DETAILED DESCRIPTION OF THE INVENTION

Figure 1:
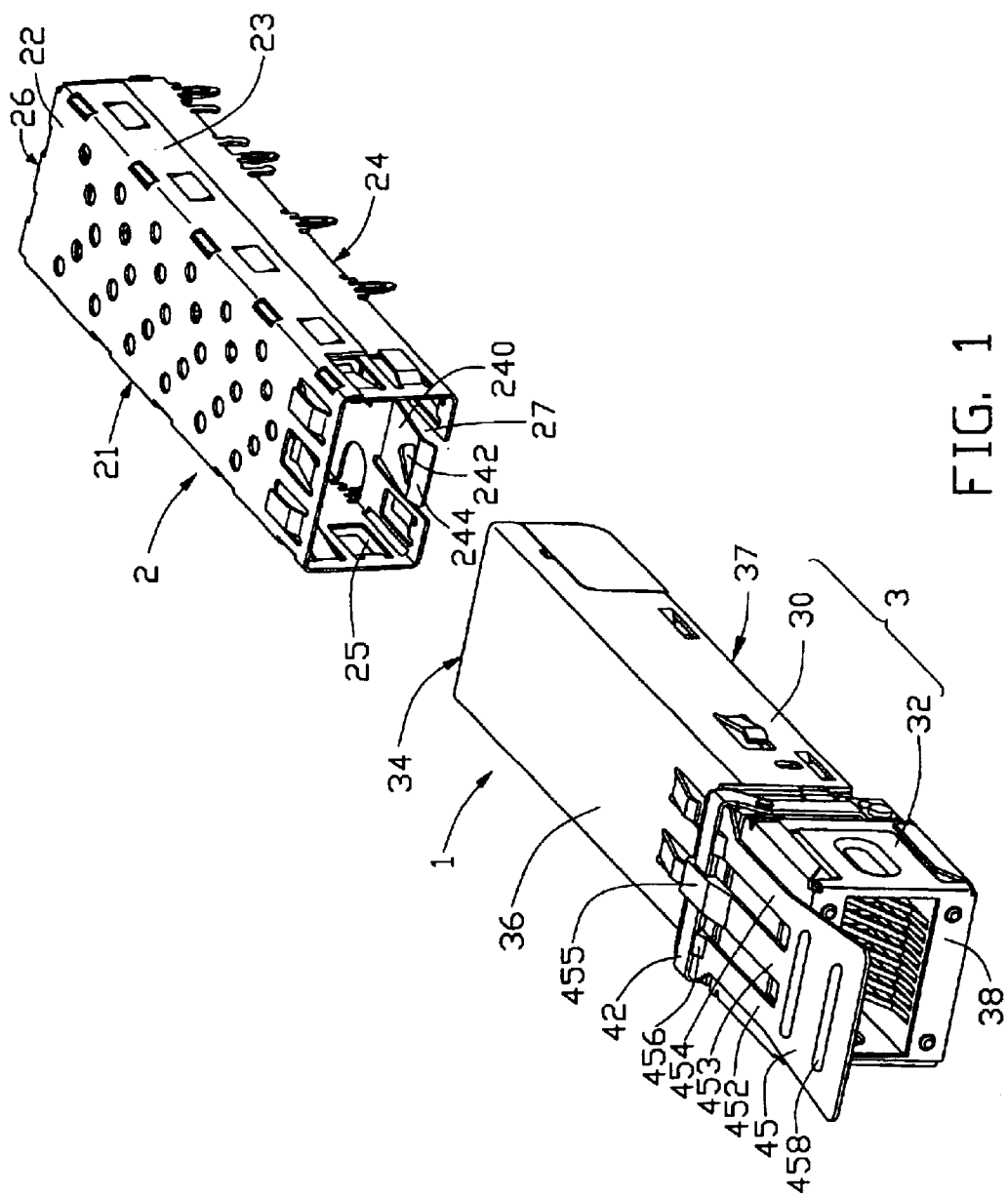
FIG. 1 is a perspective view of a small form-factor pluggable (SFP) transceiver module according to a preferred embodiment of the present invention and a receptacle for receiving the SFP transceiver module.
Figure 2:
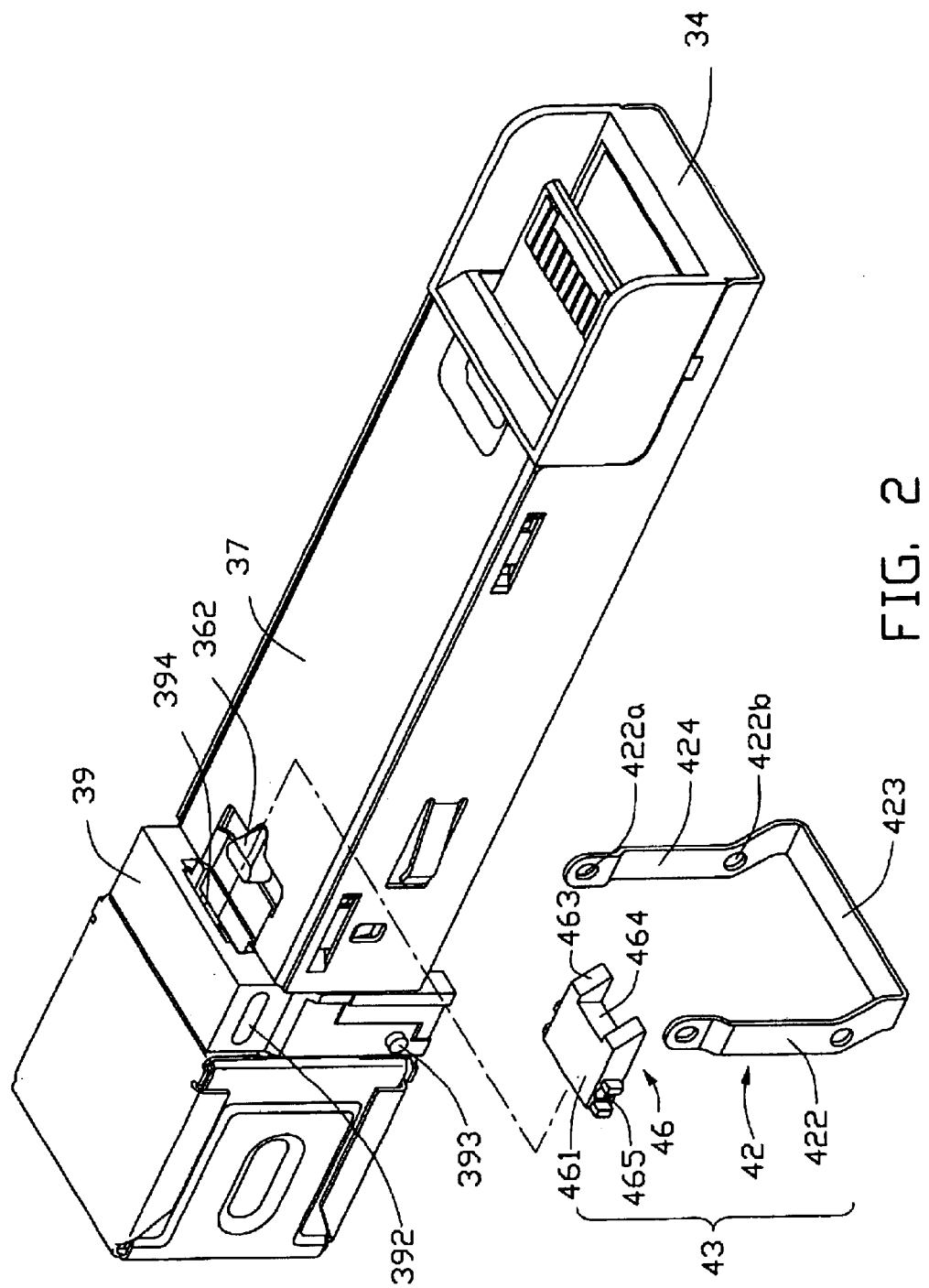
FIG. 2 is a partially exploded, perspective view of the SFP transceiver module of FIG. 1 with a pull tab removed.

Referring to FIGS. 1 and 2, a small factor-form pluggable (SFP) transceiver module 1 is to be inserted within a receptacle 2. The SFP transceiver module 1 comprises a connector assembly 3, a driving device 43, and a pull tab 45 connected to the driving device 43. The receptacle 2 is generally to be mounted to a printed circuit board (not shown).

The connector assembly 3 comprises a housing 30, an RJ interface 32, and a base 39 connected therebetween, and a plurality of electrical terminals (not labeled) received therein. The housing 30 includes a first side 36, a second side 37, and a rear end 34. A triangular tab 362 protrudes from the second side 37. The base 39 attaches at a front of the housing 30. A first through hole 392 is defined through a bottom of the base 39. The first through hole 392 is perpendicular to a common axis of the housing 30, the base 39 and the RJ interface 32. A pair of protrusions 393 protrudes from two sidewalls (not labeled) of the base 39 and is integrally formed with the base 39. A groove 394 is defined in the base 39 and is in communication with the first through hole 392. The groove 394 is perpendicular to the first through hole 392. The interface 32 includes a top surface 33 (see FIG. 3), and a mounting surface 38 having an entrance (not labeled) for receiving a corresponding electrical connector (not shown).

The driving device 43 comprises a release member 42 and a wedge member 46 connected thereto. The release member 42 is formed from one strip of material bent into a U-shape. The release member 42 has a first arm 422, a second arm 424, and a crossbeam 423 therebetween. A pair of first openings 422a is formed in a distal end (not labeled) of each of the first arm 422 and the second arm 424. A pair of second openings 422b is formed in an opposite, proximal end (not labeled) of the first arm 422 and the second arm 424. The wedge member 46 comprises a platform body 461 and a pair of slope bodies 463. A slant notch 464 is defined between the slope bodies 463. A third through hole 465 is defined through the platform body 461.

Figure 3:
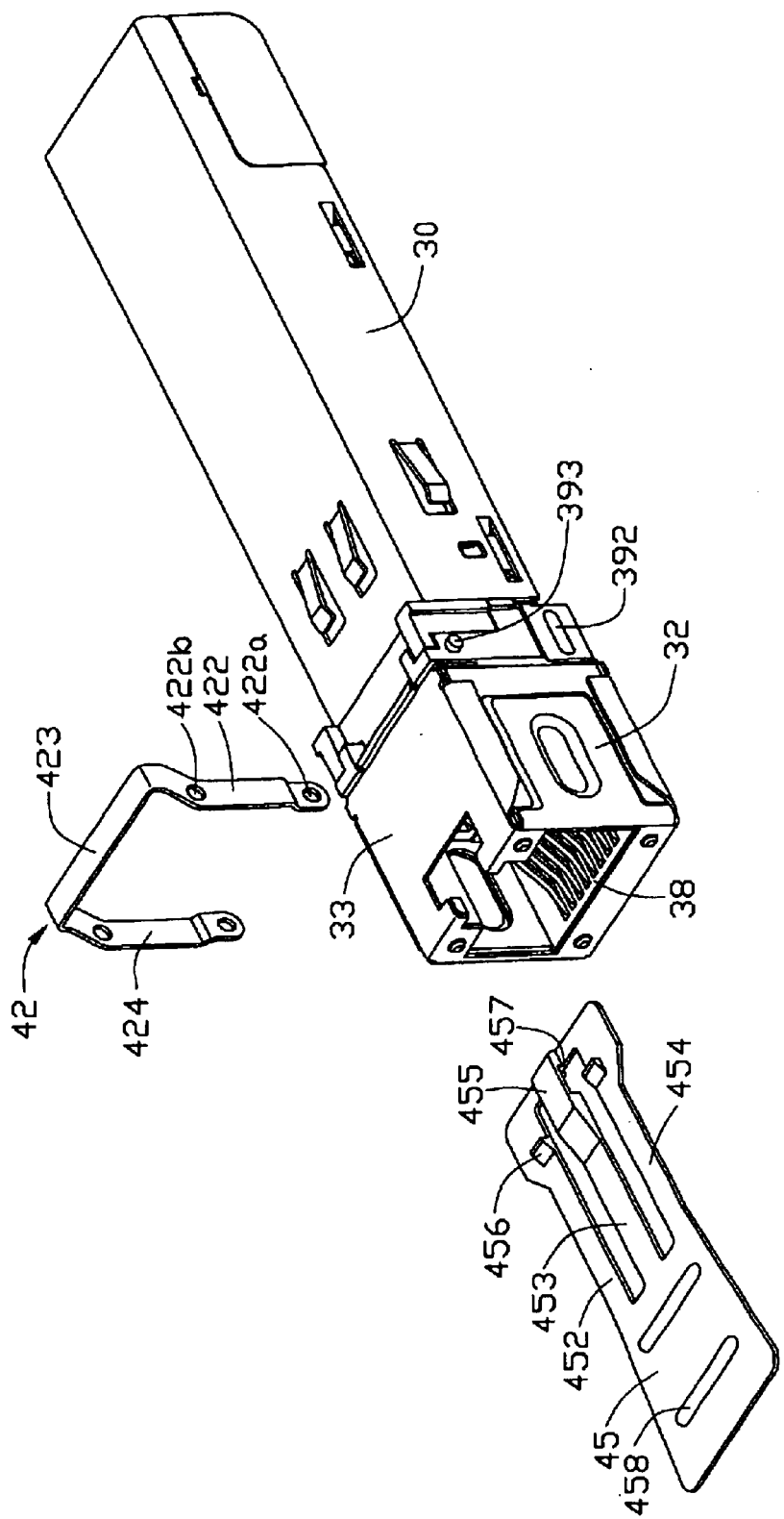
FIG. 3 is another partially exploded, perspective view of the SFP transceiver module of FIG. 1.

Referring to FIG. 3, the pull tab 45 is rectangular in shape. The pull tab 45 includes a first side arm 452, a second side arm 454, and a latch arm 453 formed therebetween along an axis of the pull tab 45. A plurality of ribs 458 protrudes from a surface of the pull tab 45. Two blocks 456 protrude from a corresponding upper surface of the first and second side arms 452 and 454, respectively. The blocks 456 are wedge-shaped. The latch-arm 453 comprises a hook-shaped end 455. The end 455 is adjacent to, between and parallel to the two blocks 456. A notch 457 is defined at a bottom of the end 455.

Referring to FIG. 1 again, the receptacle 2 for receiving the transceiver module 1 is made of conductive materials, such as copper, or other conductive materials. The receptacle 2 is formed by a left sidewall 21, a top wall 22, a right sidewall 23, a bottom wall 24, and a rear wall 26. An opening 25 is defined within the receptacle 2 to receive the SFP transceiver module 1. A bendable portion 240 is formed on the bottom wall 24 by cutting slits 27 in the bottom wall 24 adjacent a front end of the receptacle 2. A triangular hole 242 is defined in the bendable portion 240 and is sized to mate with the tab 362 on the second side 37 of the housing 30. The bendable portion 240 includes a lip 244 to a front of the hole 242. A pair of spring elements (not labeled) protrudes inwardly from the left and right sidewalls 21, 23 into the opening 25 of the receptacle 2.

Figure 4:
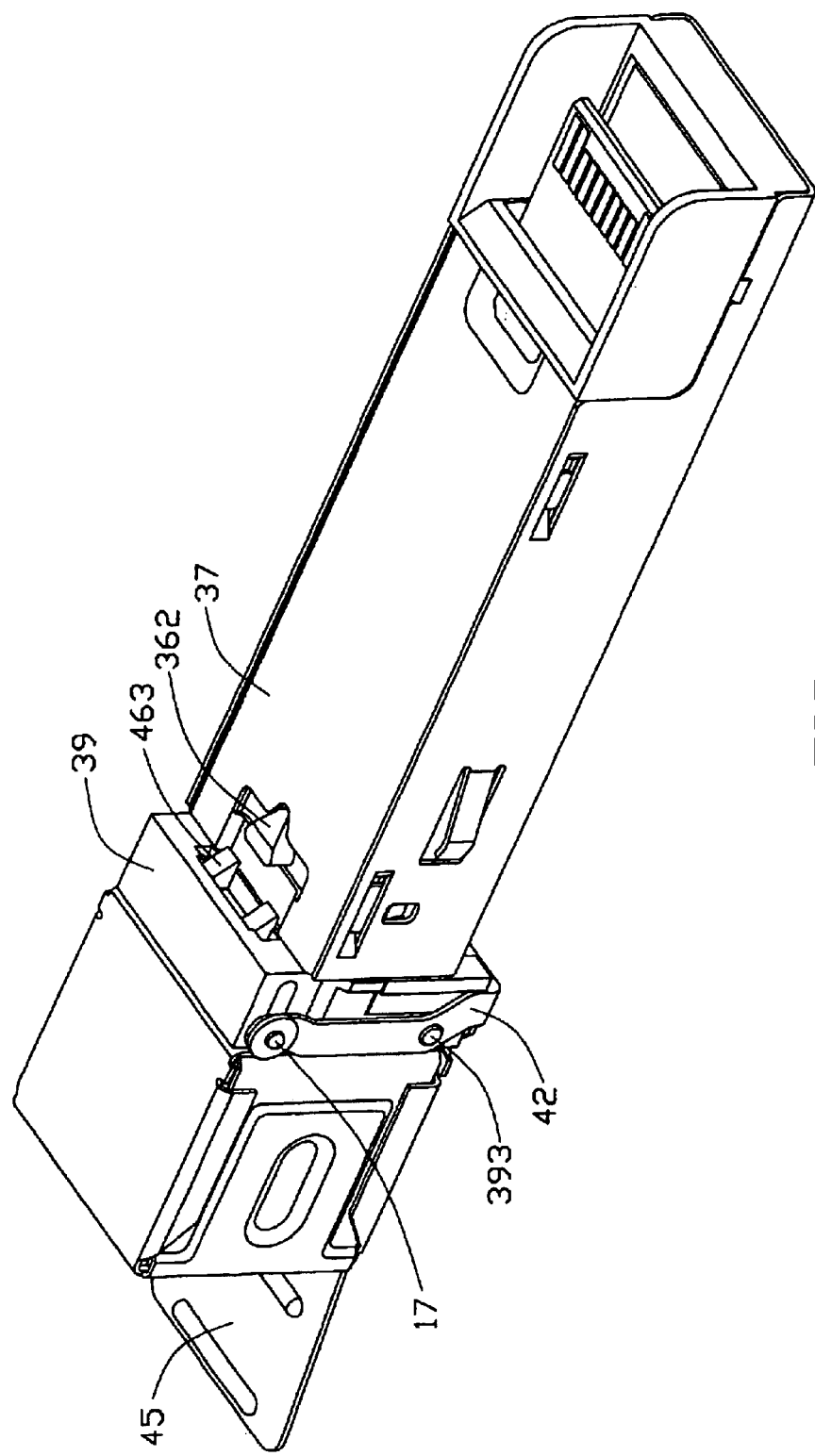
FIG. 4 is a perspective view of an assembled SFP transceiver module of FIG. 1 from a reverse angle.

Referring to FIGS. 3 and 4, during assembly of the driving device 43 and the pull tab 45 to the connector assembly 3, the release member 42 is first assembled with the pull tab 45. As previously mentioned, the release member 42 is formed from a bendable strip (not shown). During assembly of the bendable strip to the pull tab 45, the strip is inserted through the notch 457, sliding therein. When the first and second openings 422a and 422b are symmetrically arranged about the end 455, the strip is folded to form the first arm 422, the second arm 424, and the crossbeam 423. The crossbeam 423 is secured between the first side arm 452, the second side arm 454, and the end 455, and is received in the notch 457 and abuts against the two blocks 456. Next, the assembly of the pull tab 45 and the release member 42 is positioned on the top surface 33 of the RJ interface 32, with the second openings 422b engaging with the protrusions 393. The first openings 422a align with the first through hole 392, and the wedge member 46 is assembled to the base 39 with the platform body 461 at least partially inserted into the groove 394. At this time, the platform body 461 can move in the groove 394 along an axis of the housing 30. Then, the third through hole 465 of the wedge member 46, the openings 422a, and the first through hole 392 of the base 39 are all aligned. Then, a linkage pin 17 (see FIG. 4) is inserted through the first openings 422a of the release member 42, the first through hole 392, and the third through hole 465 of the wedge member 46, securing them together. The pull tab 45 and the driving device 43 are thus mounted to the connector assembly 3 and the pull tab 45 extends beyond the mounting surface 38 of the connector assembly 3.

The wedge member 46 is located between the base 39 and the tab 362, with the slant notch 464 partially receiving the tab 362. The linkage pin 17 is moveable in the first through hole 392 in a forward and rearward direction along the axis of the housing 30.

Of course, the pull tab 45 and the driving device 43 can have other structures. Therefore, there could be other, corresponding ways to assemble the pull tab 45 and the driving device 43 to the connector assembly 3. For example, the hook-shaped end 455 of the pull tab 45 can be a flexible, free end. During assembly of the driving device 43 to the connector assembly 3, the release member 42 could, therefore, attach to the base 39, with the pair of second openings 422b rotatably engaging with the protrusions 393. The first openings 422a could then align with the first through hole 392. Then, the wedge member 46 would be assembled with the release member 42, using the linkage pin 17 as was previously described. Finally, the pull tab 45 could be inserted between the crossbeam 423 of the release member 42, and the base 39, with the two blocks 456 abutting against the crossbeam 423 and with the free end 455 sliding over an outside of the crossbeam 423 so that the notch 457 thus receives the crossbeam 423 therein. The driving device 43 and the pull tab 45 would thus be mounted to the connector assembly 3, and the pull tab 45 would extend beyond the mounting surface 38 of the connector assembly 3.

When the transceiver module 1 is inserted into the receptacle 2, the rear end 34 of the housing 30 presses against the lip 244 of the bendable portion 240, pushing the bendable portion 240 downwardly, and the second side 37 of the transceiver module 1 slides along the bottom wall 24 of the receptacle 2. When the end 34 of the housing reaches and further presses against the spring elements (not shown) inside the rear of the receptacle 2, the tab 362 of the connector assembly 3 snaps into the triangular hole 242 of the bendable portion 240 of the receptacle 2. The transceiver module 1 is thus retained in the receptacle 2.

To remove the transceiver module 1 from the receptacle 2, the pull tab 45 is pulled outwardly along a direction away from the mounting surface 38, pulling the crossbeam 423 outwardly with it and driving the release member 42 to rotate about the protrusions 393. Simultaneously, the linkage pin 17, under the action of the release member 42, moves rearwardly in the first through hole 392 along a direction of the axis of the housing 30 and pushes the wedge member 46 rearwardly. Then, the slope bodies 463 of the wedge member 46 press against the lip 244 of the bendable portion 240, driving the bendable portion 240 downwardly. As a result, the tab 362 is disengaged from the triangular hole 242 and the spring elements in the rear of the receptacle 2 push the transceiver module 1 outwardly from the receptacle 2. The transceiver module 1 is then disassembled with the receptacle 2.

It is convenient for an operator to withdraw the transceiver module 1 from the receptacle 2, since the transceiver module 1 has the pull tab 45 extending beyond the mounting surface 38. The pull tab 45 is mechanically linked to the wedge member 46 by the release member 42, so that when the pull tab 45 is pulled outwardly, it drives the wedge member 46 rearwardly to press against the bendable portion 240 of the receptacle 2. This makes it easier for the transceiver module 1 to disengage from the receptacle 2. In addition, this arrangement allows the transceiver modules 1 to be closely stacked together while still being readily accessible. This advantage decreases a stacking height of multiple transceiver modules.

It is believed that the present invention and its advantages will be understood from the foregoing description and it will be apparent that various changes may be made thereto without departing from the spirit and scope of the invention or sacrificing all of its material advantages, the examples hereinbefore described merely being preferred or exemplary embodiments of the invention. For example, it is appreciated that in the embodiment the release member 42 and the wedge member 46 are hinged to each other, and the pull tab 45 and the release member are linked similarly. Anyhow, other flexible arrangements, either integrally formed or discretely formed, performing the similar moving path around these three elements as what disclosed in the embodiment, are also under the scope of the invention.

We claim:

1. A transceiver module, comprising:

a connector assembly having a mounting surface; and an actuating member assembled to the connector assembly comprising a driving element pivotally connected to the connector assembly and a pull tab having a front end extending beyond the mounting surface of the connector assembly and a rear end; wherein the driving element comprises a release member and a wedge member, the pull tab and the wedge member are mechanically connected with two ends of the release member, respectively, when the pull tab is pulled forwardly, the driving element rotates backwardly with respect to the connector assembly.

2. The transceiver module of claim 1, wherein the rear end of the pull tab is engaged with the release member and the release member is rotatably connected with the connector assembly by a pair of protrusions protruding from the connector assembly.

3. The transceiver module of claim 2, wherein the pull tab comprises a first side arm, a second side arm, and a latch arm formed therebetween along an axis of the pull tab.

4. The transceiver module of claim 3, wherein the latch arm comprises a hook-shaped end.

5. The transceiver module of claim 4, wherein a notch is formed at the bottom of the hook-shaped end.

6. The transceiver module of claim 5, wherein the release member comprises a first arm, a second arm, and a crossbeam formed therebetween.

7. The transceiver module of claim 6, wherein the notch of the latch arm receives the crossbeam of the release member.

8. The transceiver module of claim 7, wherein the pull tab comprises two blocks protruding from the surface thereof.

9. The transceiver module of claim 8, wherein the blocks abut against the crossbeam of the release member.

10. The transceiver module of claim 9, wherein the pull tab comprises a plurality of ribs protruding from a surface thereof, and the ribs are perpendicular to an axis of the pull tab.

11. A transceiver module adapted to be received within a receptacle, comprising:

a connector assembly, comprising a housing consisting of a plurality of sidewalls and an end wall, and a base attached thereto; and an actuating assembly being pivotally assembled with the base, the actuating assembly comprising a pull tab and a driving element; wherein the driving element comprises a release member and a wedge member, the pull tab is engaged with the release member, located on a top surface of one of the outside sidewalls, the wedge member is engaged with the release member, when the pull tab is pulled forwardly, the driving element rotates backwardly with respect to the base, driving the wedge member, which in turn, causing the transceiver module to be easily withdrawn from the receptacle.

12. The transceiver module of claim 11, wherein the release member comprises a first arm, a second arm, and a crossbeam therebetween, the pull tab is engaged with the crossbeam and the wedge member is engaged with the first and second arms.

13. The transceiver module of claim 12, wherein the base has first through hole defined at the bottom thereof and a groove defined along a common axis of the base and the housing, in communication with the first through hole.

14. The transceiver module of claim 13, wherein the groove receives the wedge member, and the wedge member is movable in the groove.

15. The transceiver module of claim 13, wherein the base has a pair of protrusions protruding from two sidewalls thereof, and the release member has a pair of corresponding openings to pivotally engage with the protrusions.

16. The transceiver module of claim 11, wherein the connector assembly comprises an RJ interface connected with the housing.

17. An actuating assembly adapted to be used in a SFP transceiver module, comprising:

a driving element adapted to be pivotally connected to an outer component comprising a connecting portion and a driving portion connected with the connecting portion; and a pull means connected to the connection portion having a front end adapted to extend beyond the outer component, and a rear end connected with the connecting portion, wherein, when the pull means is pulled forwardly, the connecting portion rotates with respect to the outer component, pushing the driving portion rearwardly.

18. An electrical module comprising:

housing assembly; and an actuating assembly pivotally mounted to the housing assembly and including, a pull tab located adjacent to one side of the housing, a wedge member located adjacent to an opposite side of the housing, and a release member linked therebetween; wherein said pull tab, said release member and said wedge member are arranged with a Z-like configuration wherein during operation, the release member is rotated, the pull tab is moved forwardly while the wedge member is moved rearwardly.

19. The module of claim 18, wherein said housing assembly further includes a locking tab located on the opposite side of the housing around a distal end of said wedge member.

20. The module of claim 18, wherein said pull tab, said release member and said wedge member are discrete from one another but linked together with said Z-like configuration.

* * * * *